(12) United States Patent
Guillot et al.

(10) Patent No.: US 6,197,618 B1
(45) Date of Patent: Mar. 6, 2001

(54) SEMICONDUCTOR DEVICE FABRICATION USING ADHESIVES

(75) Inventors: Marie Guillot, Cloyne; Paddy O'Shea, Graigue, both of (IE)

(73) Assignee: General Semiconductor Ireland, Macoroom (IE)

( * ) Notice: Subject to any disclaimer, the term of this patent is extended or adjusted under 35 U.S.C. 154(b) by 0 days.

(21) Appl. No.: 09/564,492

(22) Filed: May 4, 2000

(51) Int. Cl.[7] .......................... H01L 21/44; H01L 21/48; H01L 21/50

(52) U.S. Cl. .......................... 438/118; 438/109; 438/123

(58) Field of Search .......................... 438/109, 118, 438/123

(56) References Cited

U.S. PATENT DOCUMENTS 5,140,404 * 8/1992 Fogal et al. .......................... 357/70
6,017,776 * 1/2000 Jiang et al. .......................... 438/118

* cited by examiner

*Primary Examiner*—John F. Niebling
*Assistant Examiner*—David A. Zarneke
(74) *Attorney, Agent, or Firm*—Stuart H. Mayer; Mayer, Fortkort & Williams

(57) ABSTRACT

A temporary self-adherence of the individual components in a stack of semiconductor components is accomplished by the use of adhesive bodies either separate from the solder preforms used in the stack or included within the solder in the form of a tacky paste. The adhesive bodies may comprise relatively high-purity water, and adhesion of the adjoining parts is achieved by the surface tension of the water. During a single heating step, preferably performed in a protective, non-oxidizing atmosphere, the water is completely evaporated while the solder preforms are heated to form the desired solder joints.

21 Claims, 3 Drawing Sheets

ENLARGED VIEW OF
32 OR 34

ADHESIVE    METAL

SEMICONDUCTOR DEVICE FABRICATION USING ADHESIVES

BACKGROUND OF THE INVENTION

The present invention relates to the fabrication of semiconductor devices, and particularly to the temporary adhering together of device parts in self-aligned relationships within stacks of device parts prior to and during formation of soldered joints between the parts.

In a known semiconductor device fabrication process, a number of device parts, including intervening discs of solder, are loaded one on top of the other in a jig cavity and the jig is then heated to melt the solder discs to form a stack of parts that are bonded together. The loaded parts can comprise, for example, a first terminal lead, a first solder disc resting on a surface of the first lead, a semiconductor chip (or die) resting on the first disc, a second solder disc on the chip and, finally a second terminal lead contacting the second solder disc.

During the fabrication process, the jig is moved along an assembly past successive work stations where the individual parts are sequentially loaded into the jig and the loaded jig then passed through a furnace for heating and reflowing the solder. A problem that arises is that the movements of the jig and vibrations of the work stations can cause lateral displacements of the parts within the jig cavity, resulting in defective device parts bonding. Another problem is that the jig is typically made of material that is resistant to high temperatures such as aluminum, graphite, or copper-graphite. The large thermal mass of the jig may adversely affect the reflow process. For example, the thermal mass sometimes causes inconsistent, highly variable results.

An alternative approach is to provide the solder in the form of an adhesive paste, e.g., a mixture of solder particles in an adhesive matrix having a paste-like consistency. One advantage of this approach is that a jig is generally not required because the adhesive paste is relied upon to maintain parts alignment. Problems with such pastes, depending on the paste used, is that additional cleaning processes may be required to remove the matrix after completion of the soldering process. Moreover, the adhesive strength of such pastes is often not sufficiently great to maintain parts alignment during the solder reflow process. In general, while the use of solder in the form of an adhesive paste is widely used and often satisfactory, there remains a need for an alternative and improved self-adhesive parts stacking process.

SUMMARY OF THE INVENTION

In accordance with the present invention, temporary self-adherence of the components in a stack of semiconductor components is accomplished by the use of adhesive bodies either separate from the solder preforms used in the stack or included within the solder in the form of a tacky paste.

In accordance with one embodiment of the invention, the adhesive bodies comprise relatively high-purity water, and adhesion of the adjoining parts is achieved by the surface tension of the water. During a single heating step, preferably performed in a protective, non-oxidizing atmosphere, the water is completely evaporated while the solder preforms are heated to form the desired solder joints.

In accordance with another embodiment of the invention, the adhesive bodies are commercially available adhesives having the qualities of being wettable by molten solder and being chemically and physically stable at the operating temperatures of the final device. In a preferred embodiment, the adhesive bodies are of preselected, fixed dimensions comparable to the thickness of the solder joints to be formed but small in comparison to the total lateral area encompassed by the solder joints. In this manner the adhesive bodies serve as spacers while providing minimal obstruction of the flow of current and heat through the solder joints and the device components themselves.

The adhesive bodies can be applied as a separate component from the solder (e.g., water droplets) or as a component within the solder to form a self-adherent solder paste. In the latter case the adhesive bodies are permanently embedded within the soldered joints in the completed devices.

DETAILED DESCRIPTION

Figure 1:
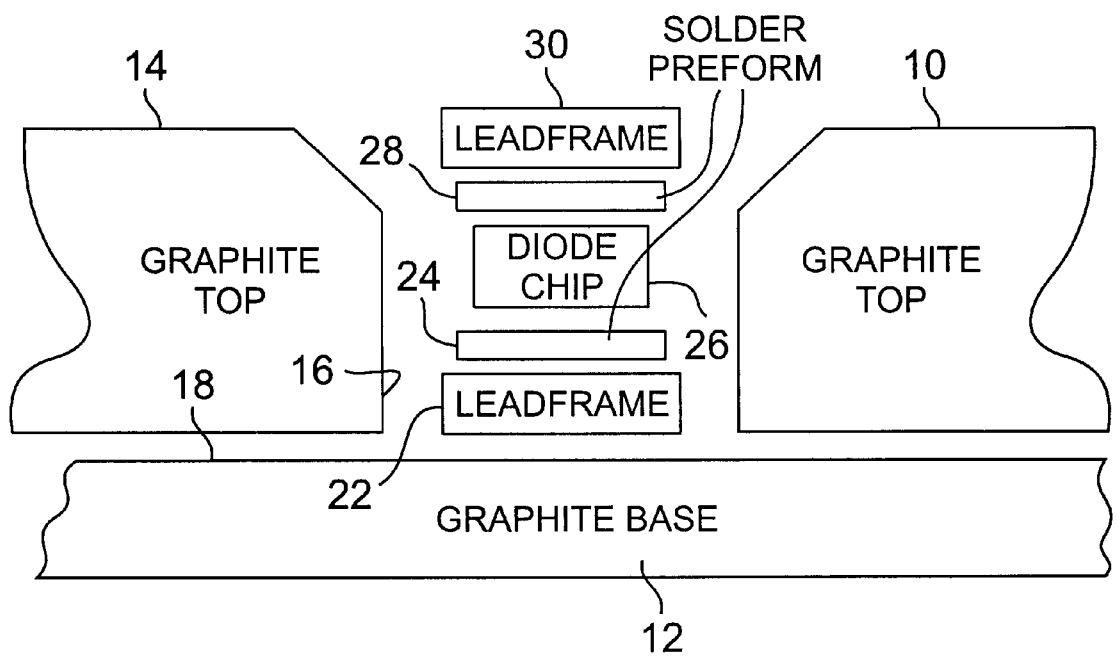
FIG. 1 shows a conventional procedure used to form a semiconductor device that includes a number of components stacked together.

As mentioned, a known practice in the fabrication of a semiconductor device is to vertically stack a number of components of the device within the cavity of an assembly jig and to then heat the jig to reflow masses of solder disposed between adjacent device components for forming solder joints therebetween. An example of such prior art practice is shown in FIG. 1, which shows a typical two-part assembly jig comprising a graphite base plate 12 overlaid by a graphite top plate 14 having an opening 16 entirely therethrough overlying surface portion 18 of the base plate. While only a single opening 16 is shown (providing a jig "cavity"), a typical manufacturing jig contains an array of identical cavities disposed in rows and columns by means of which batches of semiconductor devices can be fabricated.

Figure 2:
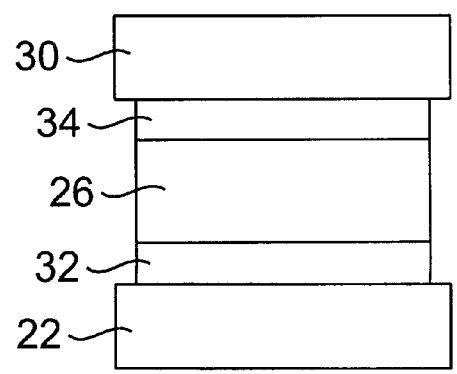
FIG. 2 shows the semiconductor device of FIG. 1 after completion of the soldering process.

The present invention can be used in the fabrication of any number of different types of semiconductor devices but, by way of example, the invention is herein described in connection with the batch fabrication of semiconductor rectifiers each comprising a single semiconductor diode chip soldered between two device terminals. In the known fabrication of such devices, as shown in FIG. 1, the device components loaded into the jig cavity 16 comprise a bottom terminal 22, a first solder preform 24, a semiconductor diode chip 26, a second solder preform 28 and a top terminal 30. In this prior art illustrative example, the solder preforms are relatively rigid (shape retaining) and are not, as initially provided, self-adhering. When first loaded into the jig, using known "pick-and-place" robot-like component transfer mechanisms, the components can be precisely laterally located within the jig cavity and precisely axially aligned with one another. FIG. 2 shows the resulting semiconductor device after the process has been completed. In FIGS. 1 and 2, like reference numerals indicate like elements. As shown, the resulting semiconductor device includes solder joints 32 and 34.

Typically, the jig is moved along an assembly line past successive operating stations where successive device components are loaded into the jig. A problem, as previously noted, is that vibrations of the assembly apparatus can cause displacement of the components within the jig cavities.

In another known prior art practice, the solder paste for the joints to be formed is made from a mix of solid solder particles and a viscous flux vehicle. This solder paste, when pre-heated at a moderate temperature (which depends on the type of flux) can be used to provide adhesion to adjacent components, prior to a final reflow heating at higher temperature and solder joint forming process. When this type of paste and process is used, the flux vehicle (which has become a residue) gets expulsed outside the solder joint during the reflow process of the solder. It is then removed from the surface by a cleaning process, leaving only solder in the finished solder joint.

Although not shown, a known practice is to include within the solder preforms or paste, as initially provided, small, rigid spacer spheres of a highly conductive material, e.g., copper. No melting or softening of the spheres occurs during any of the heating steps, either pre-heating or final. The rigid spheres, of preselected diameters, remain within the final solder joint and ensure a solder joint thickness no less than the diameter of the smallest diameter spheres. The spacer spheres are not adhesives.

Figure 3:
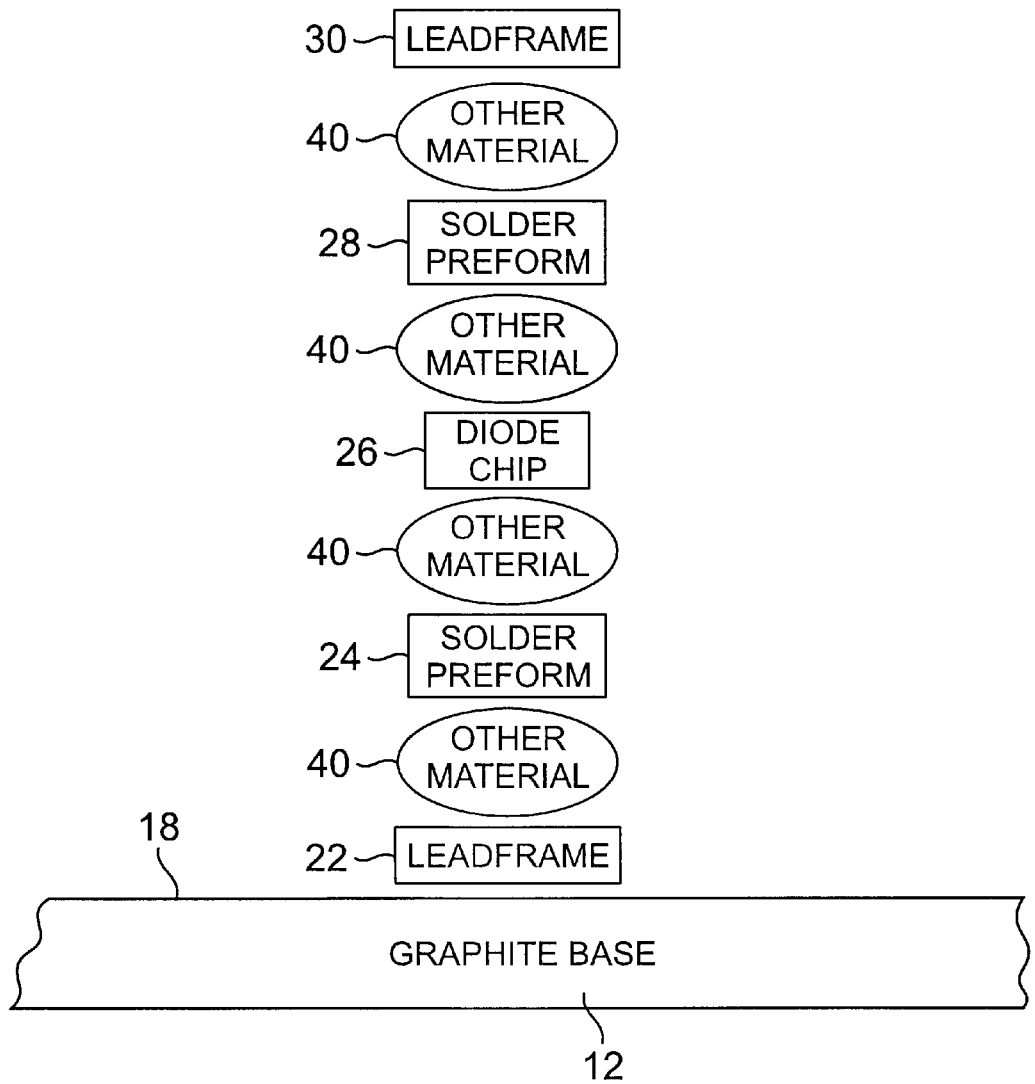
FIG. 3 shows a procedure in accordance with the present invention, which is used to form a semiconductor device that includes a number of components stacked together.

A first embodiment of the invention is now described in connection with FIG. 3. FIG. 3 shows the identical semiconductor device components shown in FIG. 1, but with the addition of adhesive bodies 40 disposed on either side of each of the solder preforms 24 and 28, which serve to adhere the solid preforms to the device components between which the preforms are disposed.

The method of assembly of the device shown in FIG. 3 can be the same as that used for the prior art FIG. 1 device with the difference that four extra "components", i.e., the adhesive bodies 40, are loaded in the illustrated order into the jig cavity. Another difference is that no preheating of the jig is done for softening the solder preforms to a tacky state. The adhesive bodies provide adhesion of components within a stable stack within the cavity.

In a first embodiment of the invention, the adhesive bodies 40 shown in FIG. 3 comprise drops of pure water, preferably de-ionized water. This embodiment of the invention will typically find limited applications because the water may facilitate oxidation and because the water may evaporate before the melting point of certain solders is reached. Because the water drops are to serve as an adhesive, the water must "wet" the contacting surfaces. Thus, while the water drops are preferably loaded into the jig cavity, in sequence with the rest of the components shown in FIG. 3, in the form of small, spherical drops, owing to the wetability of the parts by the water and the weight of the parts against the water, the water spreads into a thin layer. Adhesion of the components within the stack will be achieved by the surface tension of the water between adjacent components. During the reflow process, the water will evaporate so that the solder remains to join the device components.

In some embodiments of the invention it may be desirable to perform the reflow process in a reducing atmosphere to prevent metallic surfaces of the device components from oxidizing. Alternatively, the adhesive bodies 40 may be formed from a fluid other than water, provided that it has a high surface tension. The other fluids are preferably less likely to cause oxidation than water. Most of these fluids will be solvent-based however, and care should be taken during their evaporation process.

Figure 4A:
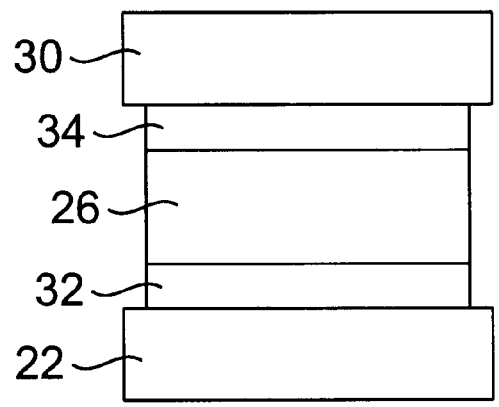
FIG. 4(a)shows the semiconductor device formed in accordance with the principles of the present invention after completion of the soldering process.

With all the components in place, as shown in FIG. 3, with thin layers 40 of water or another liquid between each component, the jig is passed through a furnace and all the components are heated to an elevated temperature. For example, for typical lead-based solders the temperature should be elevated to above 300° C. to form the solder joints. As previously mentioned, it may be advantageous to heat the components in a reducing atmosphere, particularly if water is employed. Because the water will evaporate during heating, this procedure results in the same workpiece as in FIG. 2, which is also shown in FIG. 4(a).

Figure 4B:
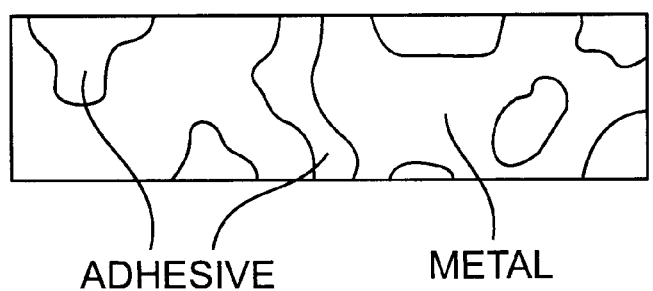
FIG. 4(b)shows an example of a solder joint employing adhesive and metal components at may be used in the present invention.

As just described, when the adhesive bodies that are employed are water, none of the "adhesive" used in the components stack shown in FIG. 3 remain after final heating and solder reflowing. In accordance with other embodiments of the invention, however, adhesive bodies are used which remain in the completed workpiece, such as shown in FIG. 4(b). These adhesive bodies are selected from commercially available adhesives having certain preferred properties as follows.

In particular, a relatively high adhesive strength is preferred to the end that only a small quantity of the adhesive is required. In this manner the interface between the adhesive and the components occupies a relatively small portion of the entire available surface area. Consequently, the electrical and thermal properties of the final joint are only due to the metal that is in the solder joints. Moreover, if only a small quantity is employed, the adhesive itself need not be conductive. Specific thermal and electrical conductivities are not herein specified owing to the wide variety of differently dimensioned devices that can be made in accordance with the invention. Rather, such properties of the adhesive will be selected by one of ordinary skill in the art based on the particular characteristics of the desired workpiece. Regardless of the adhesive that is employed, the final solder joint must meet similar specifications, e.g., electrical parameters and operating conditions, as when no adhesive is used. An ancillary benefit that may arise from the use of adhesive inside the joint is that the adhesive can serve as a stress-relief element for the internal structure. The ability of the adhesive to perform this function will depend on the properties of the adhesive and the particular device that is being formed In some embodiments of the invention the adhesive is a thermoset material. Unfortunately, currently available thermoset adhesives generally cannot withstand temperatures up to 300° C. without undergoing some degree of degradation. However, plastics are being developed which are either pure thermoplastic, which are stable up to 400° C., or a mix of thermoplastic and thermoset materials. The use of such plastics will be particularly advantageous in the present invention.

The solder that is employed may be a solder alloy or other metal that can be embedded in the adhesive. For example, a commercially available product known as a "conductive adhesive" is made of a thermoset epoxy in which particles of metal (usually silver) are embedded. While this material may be suitable for assembling certain semiconductor devices, its thermal and electrical conductivities are not currently sufficient for use with power rectifiers. The adhesive and solder may be provided in the form of preforms that are already tacky at room temperature, thus keeping all the components stacked in place from the outset. Alternatively, the adhesive and solder may be provided in the form of a tacky paste that can be easily dispensed from a syringe. If preforms are employed, they may be put in place by the same "pick-and-place" system that is used to arrange the stack of components, provided that the tackiness of the preforms is taken into account. In another alternative, the solder (paste or preform) and the adhesive are applied in a two-step operation. This procedure may be advantageous because the solder and adhesive can be selected independently of one another so that a more optimal material can be selected for each. The materials may be selected on the basis of the various properties of each material.

What is claimed is:

1. A method of assembling a semiconductor device that includes a plurality of terminals and at least one semiconductor component stacked one on top of another, said method comprising the steps of:

providing a first terminal, a first solder preform, a first semiconductor component, a second solder preform and a second terminal;

providing first, second, third and fourth adhesive bodies;

stacking on top of one another, in sequence, the first terminal, the first adhesive body, the first solder preform, the second adhesive body, the first semiconductor component, the third adhesive body, the second solder preform, the fourth adhesive body, and the second terminal; and heating the stack to a temperature sufficient to soften the solder performs so that solder joints are formed.

2. The method of claim 1 wherein said first, second, third and fourth adhesive bodies are droplets of fluid wetting surfaces in which said droplets are in contact.

3. The method of claim 1 wherein said first, second, third and fourth adhesive bodies are water drops.

4. The method of claim 3 wherein said water droplets are droplets of deionized water.

5. The method of claim 1 wherein the step of heating the stack comprises the step of heating the stack in a reducing atmosphere.

6. The method of claim 1 wherein the stacking step is performed in a cavity of a jig.

7. The method of claim 1 wherein the surface area of an interface between one of the adhesive bodies and the surface in contact therewith is smaller than the surface area of a surface of the first semiconductor component.

8. The method of claim 7 wherein said surface area of said interface is sufficiently small to alter the electrical and thermal properties of the solder joint to an insubstantial degree.

9. The method of claim 1 wherein said adhesive bodies are formed from a substantially non-conductive material.

10. The method of claim 1 wherein said semiconductor device is a rectifier.

11. The method of claim 1 wherein the adhesive bodies have an adhesive strength sufficient to maintain alignment of components forming the stack.

12. A method of assembling a semiconductor device that includes a plurality of terminals and at least one semiconductor component stacked one on top of another, said method comprising the steps of:

providing a first terminal, a first solder element, a first semiconductor component, a second solder element and a second terminal, wherein said solder elements include a substantially non-conductive component imparting adhesive properties to said solder elements;

stacking on top of one another, in sequence, the first terminal, the first solder element, the first semiconductor component, the second solder element, and the second terminal; and heating the stack to a temperature sufficient to soften the solder elements so that solder joints are formed.

13. The method of claim 11 wherein said solder elements are provided in a paste form.

14. The method of claim 11 wherein said solder elements are provided as rigid preforms.

15. The method of claim 11 wherein the stacking step is performed in a cavity of a jig.

16. The method of claim 11 wherein said semiconductor device is a rectifier.

17. The method of claim 11 wherein the solder elements have an adhesive strength sufficient to maintain alignment of components forming the stack.

18. The method of claim 2 wherein said droplets of fluids are droplets of a solvent-based fluid.

19. The method of claim 12 wherein said non-conductive component of the solder elements includes a thermoset material.

20. The method of claim 12 wherein said non-conductive component of the solder elements includes a thermoplastic material.

21. The method of claim 12 wherein said non-conductive component of the solder elements includes a thermoplastic material and a thermoset material.

* * * * *

UNITED STATES PATENT AND TRADEMARK OFFICE
CERTIFICATE OF CORRECTION

PATENT NO. : 6,197,618 B1
DATED : March 6, 2001
INVENTOR(S) : Marie Guillot et al.

It is certified that error appears in the above-identified patent and that said Letters Patent is hereby corrected as shown below:

Column 2,
Line 29, change "at" to -- that --.

Column 5,
Line 25, change "performs" to -- preforms --.

Signed and Sealed this

Thirtieth Day of October, 2001

Attest:

NICHOLAS P. GODICI
Attesting Officer — Acting Director of the United States Patent and Trademark Office